US012803577B2

(12) United States Patent

Wang et al.

(10) Patent No.: US 12,803,577 B2
(45) Date of Patent: Nov. 17, 2026

(54) RESISTOR ARRAY CIRCUIT, DIGITAL-TO-ANALOG CONVERTER CIRCUIT AND LAYOUT METHOD OF THE SAME

(71) Applicants: GLOBAL UNICHIP CORPORATION, Hsinchu City (TW); TAIWAN SEMICONDUCTOR MANUFACTURING COMPANY, LTD., Hsinchu (TW)

(72) Inventors: Ting-Hao Wang, Hsinchu City (TW); Yi-Shen Lin, Hsinchu City (TW)

(73) Assignees: GLOBAL UNICHIP CORPORATION, Hsinchu City (TW); TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 138 days.

(21) Appl. No.: 18/942,759

(22) Filed: Nov. 10, 2024

(65) Prior Publication Data

US 2025/0365003 A1 Nov. 27, 2025

(30) Foreign Application Priority Data

May 23, 2024 (TW) ................................ 113119023

(51) Int. Cl.
*H03M 1/66* (2006.01)
*H03M 1/78* (2006.01)
*H03M 1/80* (2006.01)

(52) U.S. Cl.
CPC ........... *H03M 1/808* (2013.01); *H03M 1/785* (2013.01)

(58) Field of Classification Search
CPC ......... H03M 1/808; H03M 1/785; H03M 1/78
(Continued)

(56) References Cited

U.S. PATENT DOCUMENTS 5,343,199 A 8/1994 Sugawa
5,703,588 A * 12/1997 Rivoir ................. H03M 1/0604 341/145

(Continued)

FOREIGN PATENT DOCUMENTS

CN 110912561 A 3/2020
CN 115514371 A 12/2022
TW 200915734 A 4/2009

*Primary Examiner* — Peguy Jean Pierre
(74) *Attorney, Agent, or Firm* — CKC & Partners Co., LLC

(57) ABSTRACT

A resistor array circuit comprises first and second resistor circuit strings is provided. The first and second resistor circuit strings are coupled in parallel, coupled to a signal output terminal, and configured to receive a bit signal. Each of the first and second resistor circuits comprises resistor circuits coupled sequentially, each resistor circuit comprises first, second and third resistors that are coupled sequentially and in series. The first and second resistors of each resistor circuit are coupled to the first resistor of an adjacent resistor circuit. The first, second, third resistors of each resistor circuit of the first resistor circuit string are sequentially arranged along a first direction. The third, second, first resistors of each resistor circuit of the second resistor circuit string are sequentially arranged along the first direction. Each of the first, second and third resistors has a resistance gradient increasing or decreasing along the first direction.

18 Claims, 9 Drawing Sheets

(58) Field of Classification Search
USPC .................................................. 341/144, 154
See application file for complete search history.

(56) References Cited

U.S. PATENT DOCUMENTS

| | | | | |
|---|---|---|---|---|
| 6,208,281 | B1 | 3/2001 | Jinbo et al. | |
| 6,975,261 | B1 * | 12/2005 | Isham .................. | H03M 1/068 341/154 |
| 7,095,351 | B2 * | 8/2006 | Kirby .................. | H03M 1/1057 341/145 |

* cited by examiner

600

RESISTOR ARRAY CIRCUIT, DIGITAL-TO-ANALOG CONVERTER CIRCUIT AND LAYOUT METHOD OF THE SAME

RELATED APPLICATIONS

This application claims priority to Taiwan Application Serial Number 113119023, filed on May 23, 2024, which is herein incorporated by reference in its entirety.

BACKGROUND

Technical Field

The present disclosure relates to the layout of a digital-to-analog converter circuit. More particularly, the present disclosure relates to a resistor array circuit, a digital-to-analog converter circuit and a layout method of the same that can mitigate the impact of the resistance gradient effect of the resistor array.

Description of Related Art

With the development of semiconductor technology, digital-to-analog converter (DAC) circuits are widely used in various semiconductor devices to convert digital signals into analog signals (such as voltage, current, etc.). For digital-to-analog converter circuits, the differential nonlinearity (DNL) and the integral nonlinearity (INL) are two important parameters for judging the accuracy of digital-to-analog converter circuits.

Due to the influence of the process, a resistance gradient effect may happen in a resistor array of a digital-to-analog converter circuit because of position differences, causing the DNL and INL of the digital-to-analog converter circuit to increase significantly when receiving specific signals, thereby reducing the accuracy of conversion. In order to mitigate the increasing of the DNL and INL, a layout in which the resistor array is divided into two arrays with the center as the symmetrical center was proposed. However, although this layout can mitigate the increasing of the DNL and INL, it will significantly increase the amount of routing in the resistor array. Therefore, how to improve the DNL and INL of the digital-to-analog converter circuit without significantly increasing the amount of routing in the resistor array is one of the issues in this field.

SUMMARY

A resistor array circuit is provided in the present disclosure. The resistor array circuit comprises a first resistor circuit string and a second resistor circuit string. The first resistor circuit string and the second resistor circuit string are coupled in parallel and coupled to a signal output terminal, and are configured to receive a bit signal and generate an output signal to the signal output terminal. Each of the first resistor circuit string and the second resistor circuit string comprises a plurality of resistor circuits coupled sequentially, and each of the plurality of resistor circuits comprises a first resistor, a second resistor and a third resistor that are coupled sequentially and coupled in series. The first resistor and the second resistor of each resistor circuit are coupled to the first resistor of an adjacent one of the plurality of resistor circuits. The plurality of resistor circuits of the first resistor circuit string and the second resistor circuit string are arranged along a first direction. The first resistor, the second resistor and the third resistor of each resistor circuit of the first resistor circuit string are sequentially arranged along the first direction. The third resistor, the second resistor and the first resistor of each resistor circuit of the second resistor circuit string are sequentially arranged along the first direction. Each of the first resistor, the second resistor and the third resistor has a resistance gradient, and the resistance gradient increases or decreases along the first direction.

A digital-to-analog converter circuit is provided in the present disclosure. The digital-to-analog converter circuit comprises a logic control circuit and a resistor array circuit. The logic control circuit is configured to receive a digital input signal and a clock signal and generate a bit signal. The resistor array circuit is coupled to the logic control circuit and configured to receive the bit signal. The resistor array circuit comprises a first resistor circuit string and a second resistor circuit string. The first resistor circuit string and the second resistor circuit string are coupled in parallel and coupled to a signal output terminal of the digital-to-analog converter circuit, and are configured to receive the bit signal and generate an output signal to the signal output terminal. Each of the first resistor circuit string and the second resistor circuit string comprises a plurality of resistor circuits coupled sequentially, and each of the plurality of resistor circuits comprises a first resistor, a second resistor and a third resistor that are coupled sequentially and coupled in series. The first resistor and the second resistor of each resistor circuit are coupled to the first resistor of an adjacent one of the plurality of resistor circuits. The plurality of resistor circuits of the first resistor circuit string and the second resistor circuit string are arranged along a first direction. The first resistor, the second resistor and the third resistor of each resistor circuit of the first resistor circuit string are sequentially arranged along the first direction. The third resistor, the second resistor and the first resistor of each resistor circuit of the second resistor circuit string are sequentially arranged along the first direction. Each of the first resistor, the second resistor and the third resistor has a resistance gradient, and the resistance gradient increases or decreases along the first direction.

A layout method suitable a digital-to-analog converter circuit is provided in the present disclosure. The layout method comprises: providing a substrate; disposing a logic control circuit on the substrate; disposing a first resistor circuit string coupled between the logic control circuit and a signal output terminal; and disposing a second resistor circuit string coupled between the logic control circuit and the signal output terminal and coupled in parallel with the first resistor circuit string. Each of the first resistor circuit string and the second resistor circuit string comprises a plurality of resistor circuits coupled sequentially, and each of the plurality of resistor circuits comprises a first resistor, a second resistor and a third resistor that are coupled sequentially and coupled in series. The first resistor and the second resistor of each resistor circuit are coupled to the first resistor of an adjacent one of the plurality of resistor circuits. The plurality of resistor circuits of the first resistor circuit string and the second resistor circuit string are arranged along a first direction. The first resistor, the second resistor and the third resistor of each resistor circuit of the first resistor circuit string are sequentially arranged along the first direction. The third resistor, the second resistor and the first resistor of each resistor circuit of the second resistor circuit string are sequentially arranged along the first direction. Each of the first resistor, the second resistor and the third resistor has a resistance gradient, and the resistance gradient increases or decreases along the first direction.

With the resistor array circuit, digital-to-analog converter circuit and layout method of the same in the present disclosure, the resistance gradient effect on the DNL and INL of digital-to-analog converter circuits can be mitigated without significantly increasing the amount of routing in the resistor array, thereby improving the accuracy of conversion of the digital-to-analog converter circuit.

It should be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings.

In the present disclosure, when an element is referred to as "connected", it may mean "electrically connected" or "optical connected". When an element is referred to as "coupled", it may mean "electrically coupled" or "optical coupled". "Connected" or "coupled" can also be used to indicate that two or more components operate or interact with each other. As used in the present disclosure, the singular forms "a", "one" and "the" are also intended to include plural forms, unless the context clearly indicates otherwise. It will be further understood that when used in this specification, the terms "comprises (comprising)" and/or "includes (including)" designate the existence of stated features, steps, operations, elements and/or components, but the existence or addition of one or more other features, steps, operations, elements, components, and/or groups thereof are not excluded.

Figure 1:
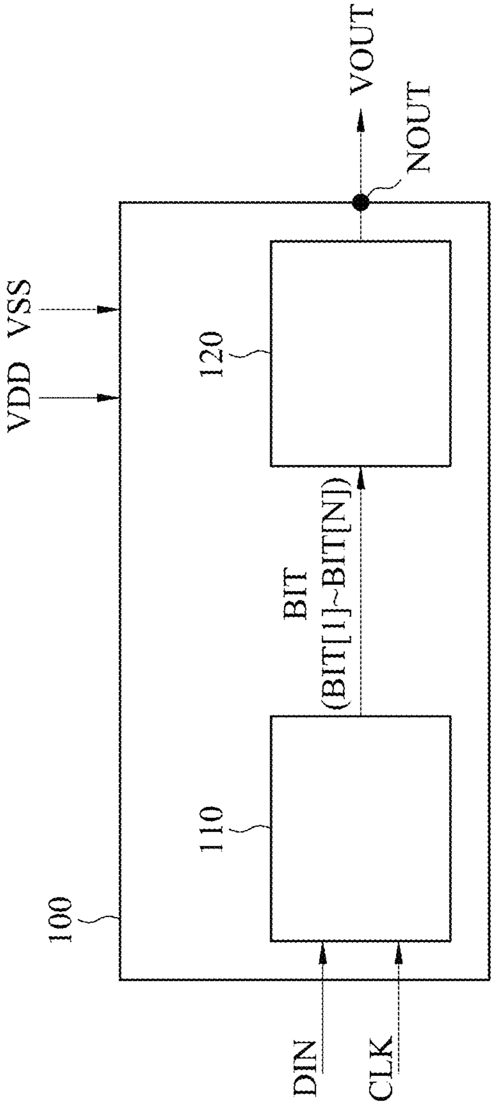
FIG. 1 is a functional block diagram of a digital-to-analog converter circuit in accordance with some embodiments of the present disclosure.

FIG. 1 is a functional block diagram of a digital-to-analog converter circuit 100 in accordance with some embodiments of the present disclosure. In some embodiments, the digital-to-analog converter circuit 100 comprises a logic control circuit 110 and a resistor array circuit 120, and is configured to receive a digital input signal DIN, a clock signal CLK and reference voltages VDD and VSS and generate an output signal VOUT. In some embodiments, the reference voltage VSS may be implemented with a ground voltage. In some embodiments, the logic control circuit 110 and the resistor array circuit 120 may be disposed on a substrate of a semiconductor device (e.g., the digital-to-analog converter circuit 100).

The logic control circuit 110 is coupled to the resistor array circuit 120, and is configured to generate a bit signal BIT to the resistor array circuit 120 according to the digital input signal DIN and the clock signal CLK. In some embodiments, the bit signal BIT comprises sub-signals BIT[1]-BIT[N], which respectively represent the plurality of bits from the least-significant-bit (LSB) to the most-significant-bit (MSB) of the bit signal BIT, wherein N is a positive integer.

The resistor array circuit 120 is coupled between the logic control circuit 110 and a signal output terminal NOUT of the digital-to-analog converter circuit 100, and is configured to for receive the bit signal BIT and generate the output signal VOUT. In some embodiments, the resistor array circuit 120 may comprise a plurality of resistor circuit strings to implement an array structure. Regarding the structure of the resistor array circuit 120, please refer to the following paragraphs.

Figure 2:
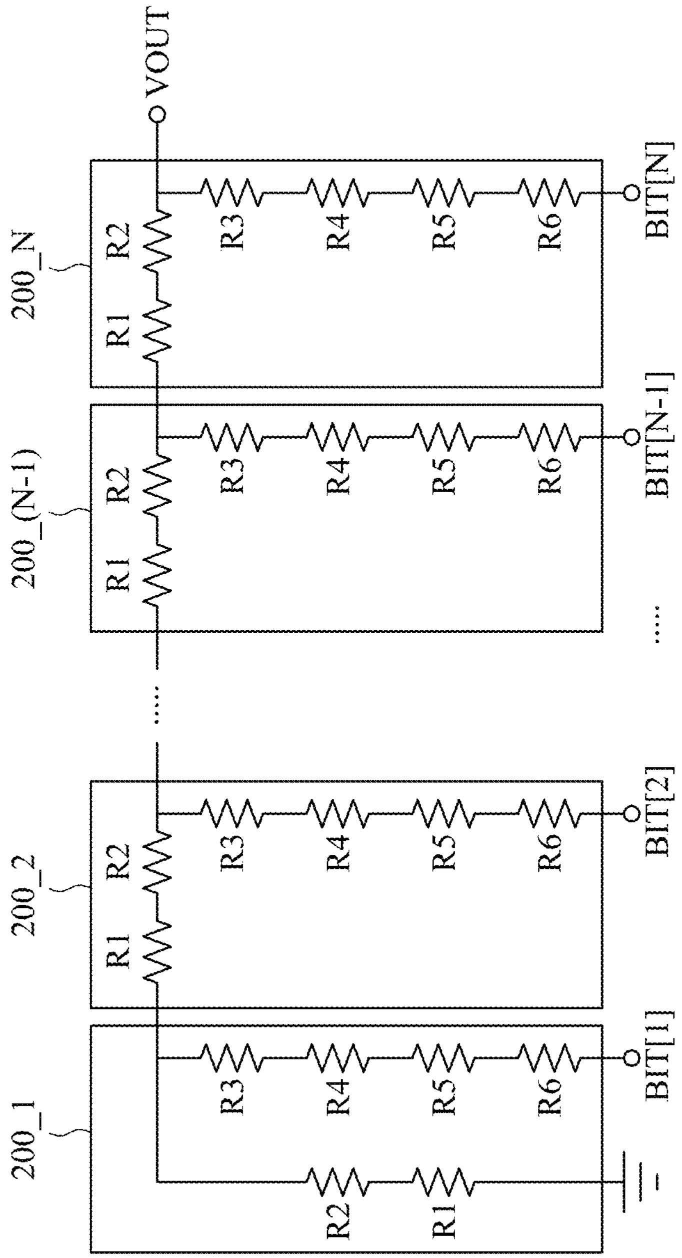
FIG. 2 is a circuit diagram of resistor circuits in accordance with some instances.

FIG. 2 is a circuit diagram of resistor circuits 200_1-200_N in accordance with some instances. In some embodiments, the resistor circuits 200_1-200_N can jointly implement the resistor array circuit 120 of FIG. 1. Each of the resistor circuits 200_1-200_N comprises resistors R1-R6 that are coupled sequentially and coupled in series, and the resistors R2 and R3 of each resistor circuit are coupled to the resistor R1 of an adjacent resistor circuit. The resistors R2 and R3 of the resistor circuit corresponding to the most-significant-bit of the bit signal BIT (e.g., the resistor circuit 200_N) are coupled to the signal output terminal NOUT, and the resistor R1 of the resistor circuit corresponding to the least-significant-bit of the bit signal BIT (e.g., the resistor circuit 200_1) is coupled to the ground voltage.

In the resistor circuits 200_1-200_N, each resistor R6 is configured to receive the sub-signals BIT[1]-BIT[N] of the bit signal BIT. For example, the resistor R6 of the resistor circuit 200_1 is configured to receive the sub-signal BIT[1], the resistor R6 of the resistor circuit 200_2 is configured to receive the sub-signal BIT[2], and so on, the resistor R6 of the resistor circuit string 200_N is configured to receive the sub-signal BIT[N].

In the instance of FIG. 2, the resistance values of the resistors R1-R6 are the same as each other. Therefore, the total resistance value of the resistors R3-R6 is twice the total resistance value of the resistors R1 and R2, so that the array formed by the resistor circuits 200_1-200_N can implement an R-2R digital-to-analog converter circuit structure.

However, due to the influence of the process, the resistors R1-R6 located at different positions in the resistor array circuit 120 will have different resistance gradients, causing the equivalent resistance values of the resistors R1-R6 to change and unable to maintain the original resistance value relationship (i.e., it cannot maintain the relationship that the total resistance value of the resistors R3-R6 is twice the total resistance value of the resistors R1 and R2), thereby affecting the INL and DNL of the digital-to-analog converter circuit 100. In order to overcome the impact of the resistance gradient effect, in some well-known instances, a specific resistor layout is applied in the resistor circuit.

Figure 3:
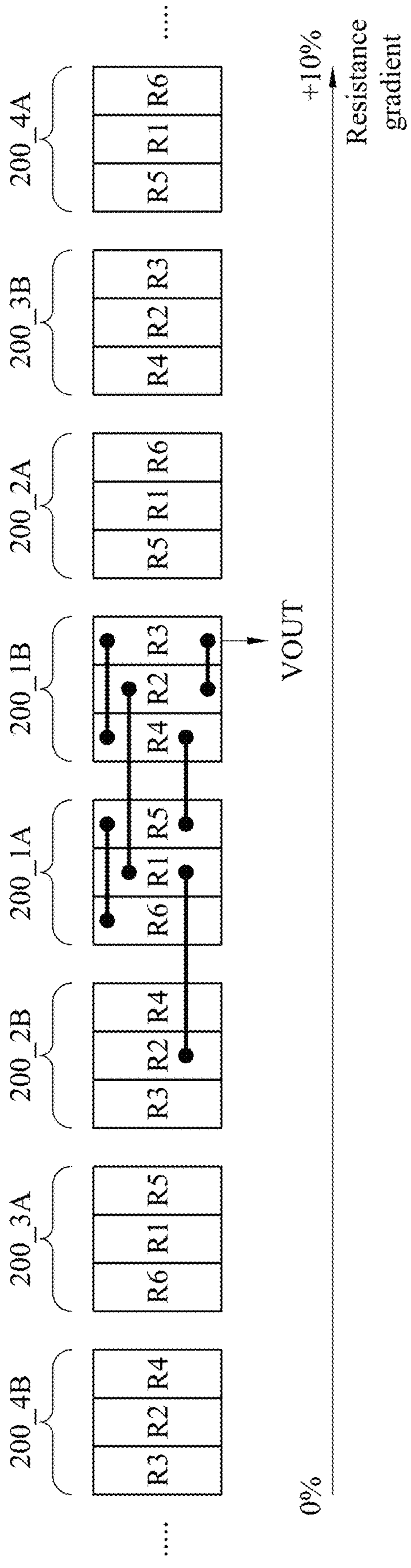
FIG. 3 is a schematic diagram of the configuration of resistors in resistor circuits in accordance with some instances.

FIG. 3 is a schematic diagram of the configuration of resistors in the resistor circuits 200_1-200_4 in accordance with some instances. In the instance of FIG. 3, each of the resistor circuits 200_1-200_4 are divided into two sub-circuits. For example, the resistor circuit 200_1 comprises sub-circuits 200_1A and 200_1B, the resistor circuit 200_2 comprises sub-circuits 200_2A and 200_2B, the resistor circuit 200_3 comprises sub-circuits 200_3A and 200_3B, and the resistor circuit 200_4 comprises sub-circuits 200_4A and 200_4B.

The sub-circuits 200_1A and 200_1B are arranged on two sides of the center of the resistor circuit. The sub-circuit 200_1A comprises the resistors R5, R1 and R6 arranged outward from the center of the resistor circuit; the sub-circuit 200_1B comprises the resistors R4, R2 and R3 arranged outward from the center of the resistor circuit. The sub-circuit 200_2A is arranged on the same side of the sub-circuit 200_1B, and also comprises the resistors R5, R1 and R6 arranged outward from the center of the resistor circuit; the sub-circuit 200_2B is arranged on the same side of the sub-circuit 200_1A, and also comprises the resistors R4, R2 and R3 arranged outward from the center of the resistor circuit. And so on, until all sub-circuits of the resistor circuit are arranged.

By alternating and arranging the resistors outward from the center of the circuit, this well-known resistor layout can mitigate the impact of the resistance gradient effect. However, since the sub-circuits of the same resistor circuit are connected to each other, the farther away from the center of the resistor circuit, the longer the routing distance between these two sub-circuits will be, thereby affecting the operating efficiency and cost of the circuit. In addition, during the manufacturing process of the circuit, due to the mismatch characteristic of routing, the physical characteristics of the routing will fluctuate irregularly with its position, causing errors in the INL and DNL, and this situation will aggravate as the routing distance increases. In order to overcome these shortcomings of the well-known resistor layout, a layout of a resistor circuit is provided in the present disclosure.

Figure 4A:
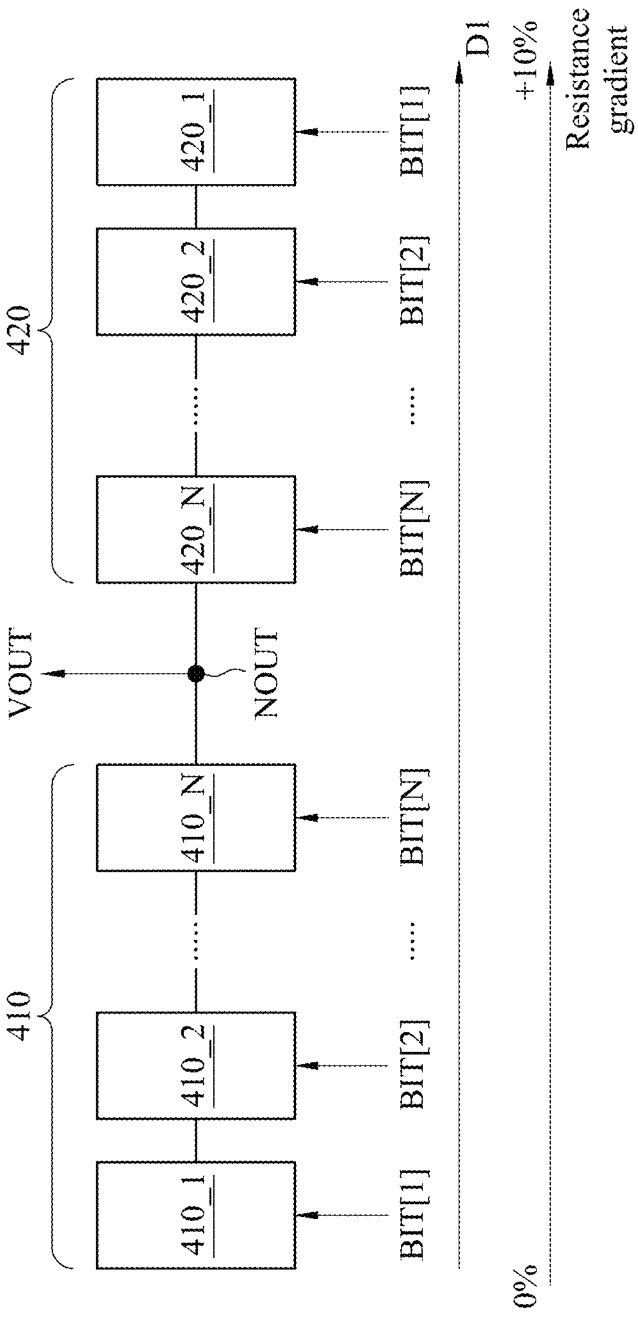
FIG. 4A is a schematic diagram of resistor circuit strings in accordance with some embodiments of the present disclosure.

FIG. 4A is a schematic diagram of resistor circuit strings 410 and 420 in accordance with some embodiments of the present disclosure. In some embodiments, the resistor circuit string 410 and the resistor circuit string 420 can be configured to jointly implement the resistor array circuit 120 of FIG. 1. The resistor circuit string 410 and the resistor circuit string 420 are coupled in parallel, coupled to the signal output terminal NOUT of the digital-to-analog converter circuit 100, and configured to receive the bit signal BIT and generate the output signal VOUT to the signal output terminal NOUT.

In some embodiments, the resistor circuit string 410 comprises resistor circuits 410_1-410_N. The resistor circuits 410_1-410_N are sequentially arranged along a direction D1, coupled to the signal output terminal NOUT in series, and respectively configured to receive the sub-signals BIT[1]~BIT[N] of the bit signal BIT. The resistor circuit string 420 comprises resistor circuits 420_1-420_N. The resistor circuits 420_1-420_N are also coupled to the signal output terminal NOUT in series, and are also respectively configured to receive the sub-signals BIT[1]~BIT[N] of the bit signal BIT. However, the resistor circuits 420_1-420_N are arranged sequentially in the opposite direction of the direction D1. Therefore, the resistor circuit strings 410 and 420 form a structure in which the corresponding resistor circuits are symmetrical to each other with the signal output terminal NOUT as the center.

In some embodiments, the resistor circuit of the resistor circuit string that is farthest from the signal output terminal NOUT is configured to receive the sub-signal corresponding to the least-significant-bit of the bit signal BIT, and the resistor circuit that is second farthest from the signal output terminal NOUT is configured to receive the sub-signal corresponding to a second least-significant-bit of the bit signal BIT, and so on, the resistor circuit that is closest to the signal output terminal NOUT is configured to receive the sub-signal corresponding to the most-significant-bit of the bit signal BIT.

Taking the embodiment of FIG. 4A as an example, the resistor circuits 410_1 and 420_1 of the resistor circuit strings 410 and 420 that are farthest from the signal output terminal NOUT are configured to receive the sub-signal BIT[1] corresponding to the least-significant-bit of the bit signal BIT. The resistor circuits 410_2 and 420_2 of the resistor circuit strings 410 and 420 that are second farthest from the signal output terminal NOUT are configured to receive the sub-signal BIT[2] corresponding to the second least-significant-bit of the bit signal BIT, and the resistor circuits 410_N and 420_N of the resistor circuit strings 410 and 420 that are closest to the signal output terminal NOUT are configured to receive the sub-signal BIT[N] corresponding to the most-significant-bit of the bit signal BIT.

Figure 4B:
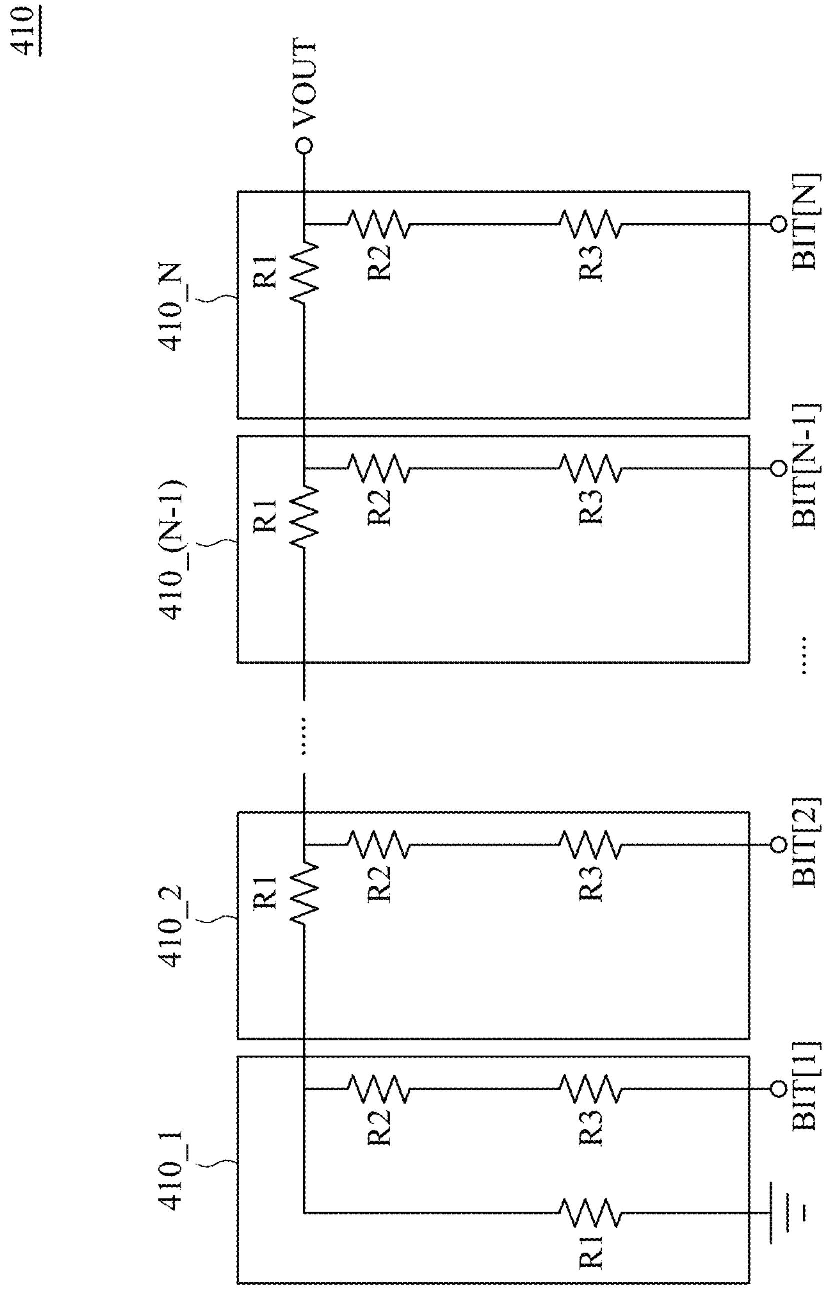
FIG. 4B is a schematic diagram of a resistor circuit string in accordance with some embodiments of the present disclosure.

Similar to the resistor circuits 200_1-200_N of FIG. 2, the resistor circuits 410_1-410_N and 420_1-420_N of FIG. 4A can also be implemented with a plurality of resistors coupled in series. The difference is that since the resistor circuits 410_1-410_N and 420_1-420_N do not need to be divided into two sub-circuits, each of them can be implemented with merely three resistors. FIG. 4B is a schematic diagram of the resistor circuit string 410 in accordance with some embodiments of the present disclosure. Since the resistor circuit strings 410 and 420 have similar structures, for the sake of brevity, FIG. 4B only illustrates the structure of the resistor circuit string 410.

In the embodiment of FIG. 4B, each of the resistor circuits 410_1-410_N comprises resistors R1-R3 coupled in series, and the resistors R1 and R2 of each resistor circuit are coupled to the resistor R1 of an adjacent resistor circuit. In some embodiments, the resistors R1 and R2 of the resistor circuit corresponding to the most-significant-bit of the bit signal BIT (e.g., the resistor circuit 410_N) are coupled to the signal output terminal NOUT, and the resistor R1 of the resistor circuit corresponding to the least-significant-bit of the bit signal BIT (e.g., the resistor circuit 410_1) is coupled to the ground voltage.

In the resistor circuits 410_1-410_N, each resistor R3 is configured to receive the sub-signals BIT[1]-BIT[N] of the bit signal BIT. For example, the resistor R3 of the resistor circuit 410_1 is configured to receive the sub-signal BIT[1], the resistor R3 of the resistor circuit 410_2 is configured to receive the sub-signal BIT[2], and so on, the resistor R3 of the resistor circuit 410_N is configured to receive the sub-signal BIT[N].

In the embodiment of FIG. 4B, the resistance values of the resistors R1-R3 are the same as each other. Therefore, similar to the instance of FIG. 2, the array formed by the resistor circuits 410_1-410_N and 420_1-420_N can implement an R-2R digital-to-analog converter circuit structure.

It should be noted that although the resistors R1-R3 are shown as separate resistive elements in FIG. 4B, the present disclosure is not limited thereto. In some embodiments, each of the resistors R1-R3 may be formed by connecting a plurality of sub-resistors in series and/or in parallel, and the resistance values of the resistors R1-R3 will be determined by the resistance values of the plurality of sub-resistors they comprises.

Figure 4C:
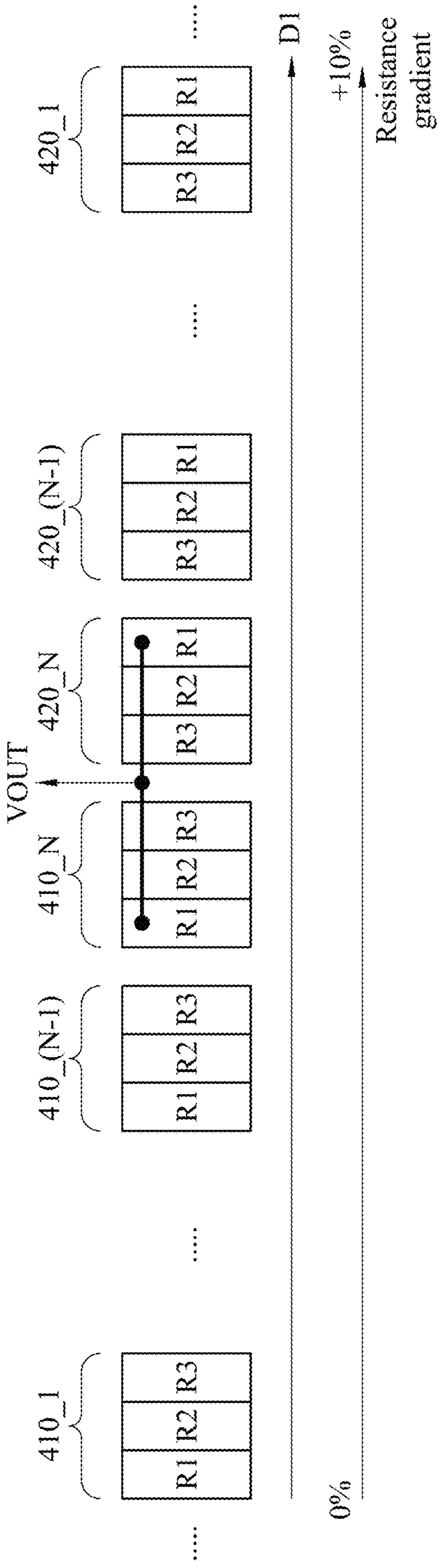
FIG. 4C is a schematic diagram of the configuration of resistors in resistor circuits in accordance with some embodiments of the present disclosure.

FIG. 4C is a schematic diagram of the configuration of the resistors R1-R3 in the resistor circuits 410_1-410_N and 420_1-420_N in accordance with some embodiments of the present disclosure. In some embodiments, in each resistor circuit of the resistor circuit string 410 (i.e., in each of the resistor circuits 410_1-410_N), the resistors R1, R2 and R3 are arranged sequentially along the direction D1; in each resistor circuit of the resistor circuit string 420 (i.e., in each of the resistor circuits 420_1-420_N), the resistors R1, R2 and R3 are arranged sequentially along the direction opposite to the direction D1 (i.e., the resistors R3, R2 and R1 are arranged sequentially along the direction D1). In other words, with the signal output terminal NOUT as the center, the plurality of resistors R1-R3 of the resistor circuit string 410 are configured to be point-symmetrical to the plurality of resistors R1-R3 of the resistor circuit string 420.

As mentioned above, in some embodiments, due to the influence of the process, the resistors R1-R3 located at different positions in the resistor array circuit 120 will have different resistance gradients. Taking the embodiment of FIG. 4C as an example, the resistance gradients of the resistors R1-R3 of the resistor circuits 410_1-410_N and 420_1-420_N will gradually increase along the direction D1. With the arrangement order of the resistors R1-R3 of the present disclosure, the impact of the resistance gradient effect can be mitigated, please refer to the description below.

Figure 4D:
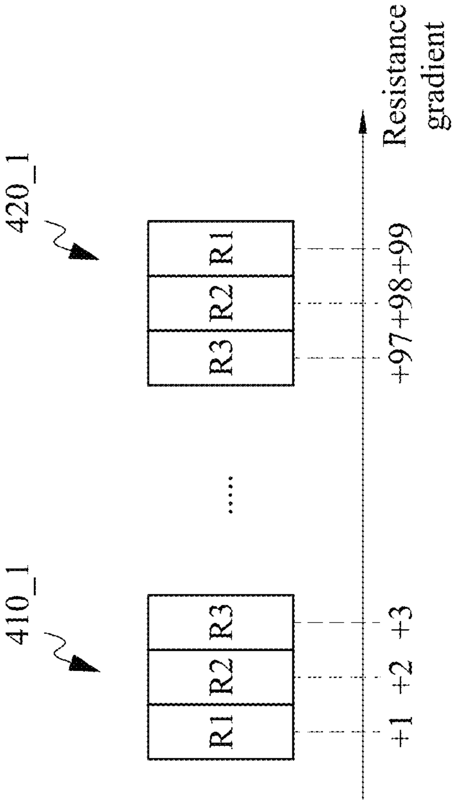
FIG. 4D is a schematic diagram of the relationship between the resistance gradient and the resistors of resistor circuits in accordance with some embodiments of the present disclosure.

FIG. 4D is a schematic diagram of the relationship between the resistance gradient and the resistors R1-R3 of the resistor circuits 410_1 and 420_1 in accordance with some embodiments of the present disclosure. In the embodiment of FIG. 4D and Table 1 below, the resistance gradients received by the resistors R1-R3 of the resistor circuit 410_1 are +1, +2 and +3 respectively according to their positions, and the resistance gradients received by the resistors R1-R3 of the resistor circuit 420_1 are +99, +98 and +97 respectively according to their positions. In other words, for the resistor circuits 410_1 and 420_1 corresponding to each other, the sum of the resistance gradients received by the resistor R1 is +100, the sum of the resistance gradients received by the resistor R2 is +100, and the sum of the resistance gradients received by the resistor R3 is also +100.

TABLE 1

| Resistor | R1 | | R2 | | R3 | |
|---|---|---|---|---|---|---|
| Resistor Circuit | 410_1 | 420_1 | 410_1 | 420_1 | 410_1 | 420_1 |
| Resistance Gradient | +1 | +99 | +2 | +98 | +3 | +97 |
| | +100 | | +100 | | +100 | |

Similarly, for the resistors R1-R3 of the resistor circuits 410_2 and 420_2 (not shown in FIG. 4D) that correspond to each other, the sum of the resistance gradients received by the resistors R1, R2 and R3 of these two resistor circuits will also be the same, and the sum of the resistance gradients of any other two corresponding resistor circuits will also be the same value, thus the details will not be repeated here.

Therefore, under the configuration of the resistors R1-R3 in the resistor circuits 410_1-410_N and 420_1-420_N provided in the present disclosure, even if the resistors R1-R3 are affected by the resistance gradient effect, the sum of the resistance gradients received by the two resistors of the corresponding two resistor circuits will all be the same. In other words, for each set of two resistors, the resistance gradient effects become equal to each other after summing, thus avoiding affecting the calculation of INL and DNL.

In addition, compared with traditional layouts in which the resistors of the resistor circuit are divided into two connected sub-circuits with the center as the symmetrical center, since the resistors of the resistor circuits in the present disclosure (e.g., the resistors R1-R3 of the resistor circuit 410_1) are located on the same side of the signal output terminal NOUT, the length of the routing will not be significantly increased, thereby improving the circuit complexity and manufacturing time.

Figure 5:
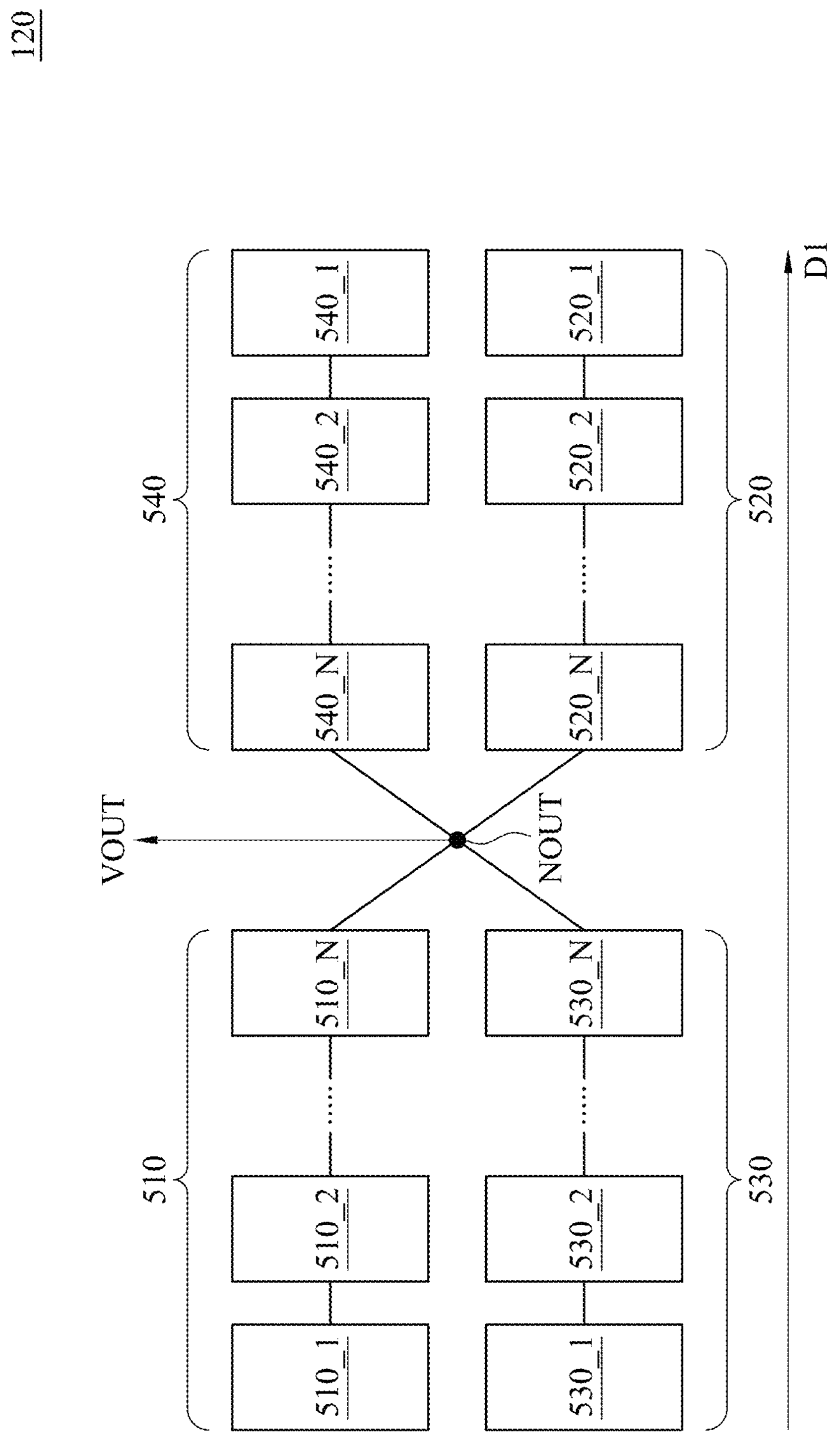
FIG. 5 is a schematic diagram of a resistor array circuit in accordance with some embodiments of the present disclosure.

In some embodiments, the resistor array circuit 120 may comprise more than two resistor circuit strings. FIG. 5 is a schematic diagram of the resistor array circuit 120 in accordance with other embodiments of the present disclosure. In the embodiment of FIG. 5, the resistor array circuit 120 comprises resistor circuit strings 510, 520, 530 and 540, wherein the configurations of the plurality of resistor circuits and the plurality of resistors therein of the resistor circuit strings 510 and 530 are respectively similar to the resistor circuit strings 410 and 420, and the configurations of the plurality of resistor circuits and the plurality of resistors therein of the resistor circuit strings 520 and 540 are respectively similar to the resistor circuit strings 410 and 420 in FIG. 4A. In other words, the arrangement direction and connection relationship of the resistors in the resistor circuits 510_1-510_N and 530_1-530_N in the resistor circuit strings 510 and 530 are similar to the resistor circuit string 410, and the arrangement direction and connection relationship of the resistors in the resistor circuits 520_1-520_N and 540_1-540_N in the resistor circuit strings 520 and 540 are similar to the resistor circuit string 420.

The difference between the resistor circuit strings 510, 520, 530, 540 in FIG. 5 and the resistor circuit strings 410, 420 in FIG. 4A is that the resistor circuit strings 410 and 420 in FIG. 4A form an array comprising two rows and one column, and the resistor circuit strings 510, 520, 530 and 540 in FIG. 5 form an array comprising two rows and two columns, wherein the resistor circuit strings 510 and 520 are located in two diagonal ones of the array, and the resistor circuit strings 530 and 540 are located in the other two diagonal ones of the array. In other words, in the resistor array circuit 120 of FIG. 5, with the signal output terminal NOUT as the center, the resistor circuit strings 510 and 520 are point symmetrical to each other, and the resistor circuit strings 530 and 540 are point symmetrical to each other.

Therefore, the resistor array circuit 120 implemented by the resistor circuit strings 410 and 420 in FIG. 4A of the present disclosure can implement a one-dimensional resistor array structure, and the resistor array circuit 120 in the embodiment of FIG. 5 of the present disclosure can implement a two-dimensional resistor array structure.

In some embodiments not shown, the resistor array circuit 120 may comprise more than four resistor circuit strings. These resistor circuit strings can form an array comprising multiple rows and multiple columns, and each two of them are point symmetrical to each other with the signal output terminal NOUT as the center. In other embodiments not shown, the resistor array circuit 120 may comprise at least eight resistor circuit strings. These resistor circuit strings can form a three-dimensional array comprising multiple rows, multiple columns and and multiple layers, and each two of them are point symmetrical to each other with the signal output terminal NOUT as the center.

Figure 6:
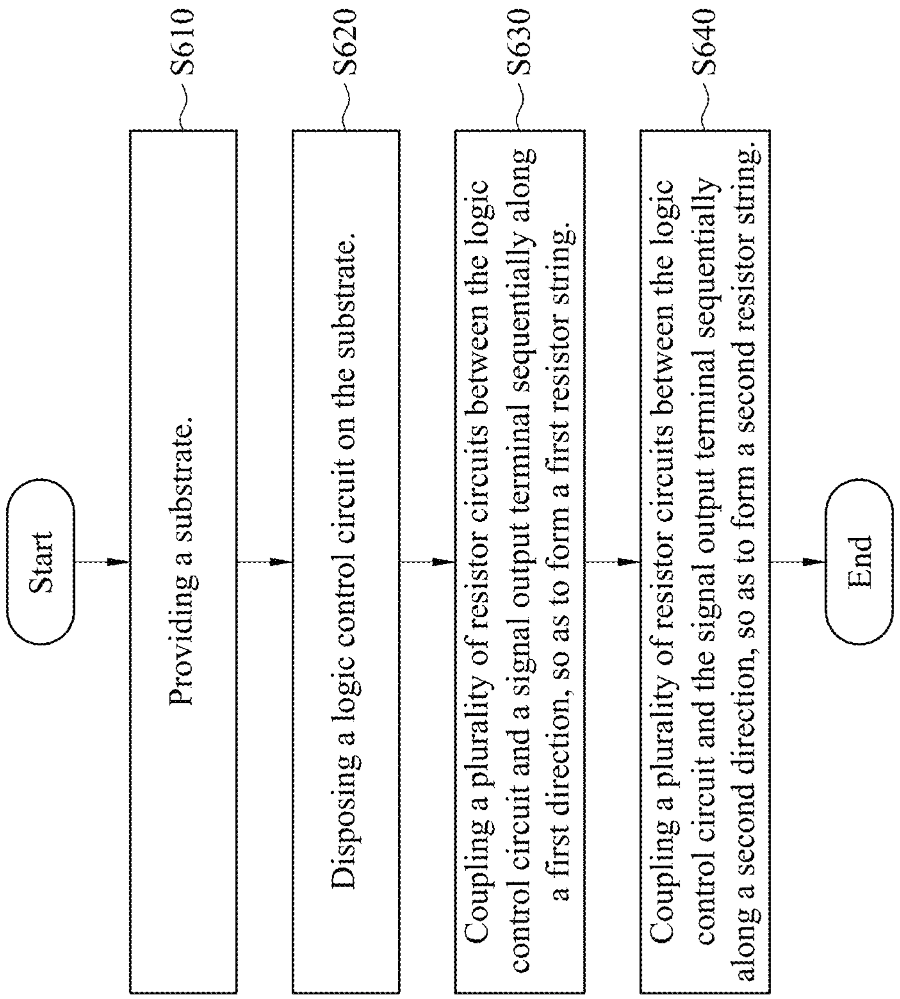
FIG. 6 is a layout method of a digital-to-analog converter circuit in accordance with some embodiments of the present disclosure.

FIG. 6 is a layout method 600 of a digital-to-analog converter circuit in accordance with some embodiments of the present disclosure. In some embodiments, the layout method 600 is used to manufacture a digital-to-analog converter circuit (e.g., the digital-to-analog converter circuit 100 in FIG. 1) and comprises steps S610, S620, S630 and S640.

In step S610, a substrate is provided for the dispositions of circuit components in subsequent steps. Next, step S620 is performed.

In step S620, a logic control circuit (e.g., the logic control circuit 110 in FIG. 1) is disposed on the substrate. Next, step S630 is performed.

In step S630, a plurality of resistor circuits (e.g., the resistor circuits 410_1-410_N) coupled sequentially along a first direction (e.g., the direction D1) and coupled between the logic control circuit and the signal output terminal are disposed, so as to form a first resistor circuit string (e.g., the resistor circuit string 410). Next, step S640 is performed.

In step S640, a plurality of resistor circuits (e.g., the resistor circuits 420_1-420_N) coupled sequentially along a second direction (e.g., the direction opposite to the direction D1) and coupled between the logic control circuit and the signal output terminal are disposed, so as to form a second resistor circuit string (e.g., the resistor circuit string 420).

It should be noted that the number and order of steps in the layout method 600 in the present disclosure are only examples, and are not intended to limit the present disclosure. Other numbers and orders of steps are within the scope of the present disclosure. In some embodiments, step S630 and step S640 may be performed synchronously. In some embodiments, step S630 may be performed after step S640.

With the resistor array circuit, digital-to-analog converter circuit and layout method of the present disclosure, the resistance gradient effect and the routing mismatch of traditional layout in resistor array circuits can be mitigated without significantly increasing the routing complexity of the digital-to-analog converter circuit, thereby improve the INL and DNL of the digital-to-analog converter circuit and enhance the conversion accuracy of the digital-to-analog converter circuit.

The above are preferred embodiments of the present disclosure. It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A resistor array circuit, comprising:

a first resistor circuit string; and a second resistor circuit string, wherein the first resistor circuit string and the second resistor circuit string are coupled in parallel and coupled to a signal output terminal, and are configured to receive a bit signal and generate an output signal to the signal output terminal, wherein each of the first resistor circuit string and the second resistor circuit string comprises a plurality of resistor circuits coupled sequentially, and each of the plurality of resistor circuits comprises a first resistor, a second resistor and a third resistor that are coupled sequentially and coupled in series, wherein the first resistor and the second resistor of each resistor circuit are coupled to the first resistor of an adjacent one of the plurality of resistor circuits, wherein the plurality of resistor circuits of the first resistor circuit string and the second resistor circuit string are arranged along a first direction, wherein the first resistor, the second resistor and the third resistor of each resistor circuit of the first resistor circuit string are sequentially arranged along the first direction, wherein the third resistor, the second resistor and the first resistor of each resistor circuit of the second resistor circuit string are sequentially arranged along the first direction, wherein each of the first resistor, the second resistor and the third resistor has a resistance gradient, and the resistance gradient increases or decreases along the first direction, and wherein the bit signal comprises a plurality of sub-signals, and the plurality of resistor circuits of each of the first resistor circuit string and the second resistor circuit string are respectively configured to receive the plurality of sub-signals.

2. The resistor array circuit of claim 1, wherein the resistance values of the first resistor, the second resistor and the third resistor are the same as each other.

3. The resistor array circuit of claim 2, wherein each of the first resistor, the second resistor and the third resistor comprises a plurality of sub-resistors, and the resistance value of each of the first resistor, the second resistor and the third resistor is determined according to the resistance values of the plurality of sub-resistors of each of the first resistor, the second resistor and the third resistor.

4. The resistor array circuit of claim 1, wherein the third resistor of the plurality of resistor circuits of each of the first resistor circuit string and the second resistor circuit string is respectively configured to receive the plurality of sub-signals.

5. The resistor array circuit of claim 1, wherein one of the plurality of resistor circuits of the first resistor circuit string that is closest to the signal output terminal is configured to receive a most-significant-bit signal of the plurality of sub-signals, and one of the plurality of resistor circuits of the second resistor circuit string that is closest to the signal output terminal is configured to receive the most-significant-bit signal.

6. The resistor array circuit of claim 5, wherein another one of the plurality of resistor circuits of the first resistor circuit string that is farthest from the signal output terminal is configured to receive a least-significant-bit signal of the plurality of sub-signals, and another one of the plurality of resistor circuits of the second resistor circuit string that is farthest from the signal output terminal is configured to receive the least-significant-bit signal.

7. The resistor array circuit of claim 1, further comprising:

a third resistor circuit string; and a fourth resistor circuit string, wherein the third resistor circuit string and the fourth resistor circuit string are coupled in parallel and coupled to the signal output terminal, and are configured to receive the bit signal and generate an output signal to the signal output terminal, wherein each of the third resistor circuit string and the fourth resistor circuit string comprises a plurality of resistor circuits coupled sequentially, wherein the plurality of resistor circuits of the third resistor circuit string and the fourth resistor circuit string are arranged along the first direction, wherein the first resistor, the second resistor and the third resistor of each resistor circuit of the third resistor circuit string are sequentially arranged along the first direction, wherein the third resistor, the second resistor and the first resistor of each resistor circuit of the fourth resistor circuit string are sequentially arranged along the first direction, and wherein the first resistor circuit string, the second resistor circuit string, the third resistor circuit string and the fourth resistor circuit string form an array with two rows and two columns in the resistor array circuit, the first resistor circuit string and the second resistor circuit string are located in two diagonal ones of the array, and the third resistor circuit string and the fourth resistor circuit string are located in the other two diagonal ones of the array.

8. A digital-to-analog converter circuit, comprising:

a logic control circuit, configured to receive a digital input signal and a clock signal and generate a bit signal; and a resistor array circuit, coupled to the logic control circuit and configured to receive the bit signal, wherein the resistor array circuit comprises:

a first resistor circuit string; and a second resistor circuit string, wherein the first resistor circuit string and the second resistor circuit string are coupled in parallel and coupled to a signal output terminal of the digital-to-analog converter circuit, and are configured to receive the bit signal and generate an output signal to the signal output terminal, wherein each of the first resistor circuit string and the second resistor circuit string comprises a plurality of resistor circuits coupled sequentially, and each of the plurality of resistor circuits comprises a first resistor, a second resistor and a third resistor that are coupled sequentially and coupled in series, wherein the first resistor and the second resistor of each resistor circuit are coupled to the first resistor of an adjacent one of the plurality of resistor circuits, wherein the plurality of resistor circuits of the first resistor circuit string and the second resistor circuit string are arranged along a first direction, wherein the first resistor, the second resistor and the third resistor of each resistor circuit of the first resistor circuit string are sequentially arranged along the first direction, wherein the third resistor, the second resistor and the first resistor of each resistor circuit of the second resistor circuit string are sequentially arranged along the first direction, wherein each of the first resistor, the second resistor and the third resistor has a resistance gradient, and the resistance gradient increases or decreases along the first direction, and wherein the bit signal comprises a plurality of sub-signals, and the plurality of resistor circuits of each of the first resistor circuit string and the second resistor circuit string are respectively configured to receive the plurality of sub-signals.

9. The digital-to-analog converter circuit of claim 8, wherein the resistance values of the first resistor, the second resistor and the third resistor are the same as each other.

10. The digital-to-analog converter circuit of claim 9, wherein each of the first resistor, the second resistor and the third resistor comprises a plurality of sub-resistors, and the resistance value of each of the first resistor, the second resistor and the third resistor is determined according to the resistance values of the plurality of sub-resistors of each of the first resistor, the second resistor and the third resistor.

11. The digital-to-analog converter circuit of claim 8, wherein the third resistor of the plurality of resistor circuits of each of the first resistor circuit string and the second resistor circuit string is respectively configured to receive the plurality of sub-signals.

12. The digital-to-analog converter circuit of claim 8, wherein one of the plurality of resistor circuits of the first resistor circuit string that is closest to the signal output terminal is configured to receive a most-significant-bit signal of the plurality of sub-signals, and one of the plurality of resistor circuits of the second resistor circuit string that is closest to the signal output terminal is configured to receive the most-significant-bit signal.

13. The digital-to-analog converter circuit of claim 12, wherein another one of the plurality of resistor circuits of the first resistor circuit string that is farthest from the signal output terminal is configured to receive a least-significant-bit signal of the plurality of sub-signals, and another one of the plurality of resistor circuits of the second resistor circuit string that is farthest from the signal output terminal is configured to receive the least-significant-bit signal.

14. The digital-to-analog converter circuit of claim 8, wherein the resistor array circuit further comprises:

a third resistor circuit string; and a fourth resistor circuit string, wherein the third resistor circuit string and the fourth resistor circuit string are coupled in parallel and coupled to the signal output terminal, and are configured to receive the bit signal and generate an output signal to the signal output terminal, wherein each of the third resistor circuit string and the fourth resistor circuit string comprises a plurality of resistor circuits coupled sequentially, wherein the plurality of resistor circuits of the third resistor circuit string and the fourth resistor circuit string are arranged along the first direction, wherein the first resistor, the second resistor and the third resistor of each resistor circuit of the third resistor circuit string are sequentially arranged along the first direction, wherein the third resistor, the second resistor and the first resistor of each resistor circuit of the fourth resistor circuit string are sequentially arranged along the first direction, and wherein the first resistor circuit string, the second resistor circuit string, the third resistor circuit string and the fourth resistor circuit string form an array with two rows and two columns in the resistor array circuit, the first resistor circuit string and the second resistor circuit string are located in two diagonal ones of the array, and the third resistor circuit string and the fourth resistor circuit string are located in the other two diagonal ones of the array.

15. A layout method, suitable a digital-to-analog converter circuit and comprising:

providing a substrate;

disposing a logic control circuit on the substrate;

disposing a first resistor circuit string coupled between the logic control circuit and a signal output terminal; and disposing a second resistor circuit string coupled between the logic control circuit and the signal output terminal and coupled in parallel with the first resistor circuit string, wherein each of the first resistor circuit string and the second resistor circuit string comprises a plurality of resistor circuits coupled sequentially, and each of the plurality of resistor circuits comprises a first resistor, a second resistor and a third resistor that are coupled sequentially and coupled in series, wherein the first resistor and the second resistor of each resistor circuit are coupled to the first resistor of an adjacent one of the plurality of resistor circuits, wherein the plurality of resistor circuits of each of the first resistor circuit string and the second resistor circuit string respectively receive a plurality of sub-signals, and the plurality of sub-signals are contained in a bit signal generated by the logic control circuit, wherein the plurality of resistor circuits of the first resistor circuit string and the second resistor circuit string are arranged along a first direction, wherein the first resistor, the second resistor and the third resistor of each resistor circuit of the first resistor circuit string are sequentially arranged along the first direction, wherein the third resistor, the second resistor and the first resistor of each resistor circuit of the second resistor circuit string are sequentially arranged along the first direction, and wherein each of the first resistor, the second resistor and the third resistor has a resistance gradient, and the resistance gradient increases or decreases along the first direction.

16. The layout method of claim 15, wherein the resistance values of the first resistor, the second resistor and the third resistor are the same as each other.

17. The layout method of claim 16, wherein disposing the first resistor circuit string coupled between the logic control circuit and the signal output terminal comprises:

disposing a plurality of sub-resistors coupled between the logic control circuit and the signal output terminal, so as to form the first resistor, the second resistor and the third resistor of the first resistor circuit string; and disposing the second resistor circuit string coupled between the logic control circuit and the signal output terminal and coupled in parallel with the first resistor circuit string comprises:

disposing a plurality of sub-resistors coupled between the logic control circuit and the signal output terminal, so as to form the first resistor, the second resistor and the third resistor of the second resistor circuit string, wherein the resistance value of each of the first resistor, the second resistor and the third resistor is determined according to the resistance values of the plurality of sub-resistors of each of the first resistor, the second resistor and the third resistor.

18. The layout method of claim 15, further comprising:

disposing a third resistor circuit string coupled between the logic control circuit and the signal output terminal; and disposing a fourth resistor circuit string coupled between the logic control circuit and the signal output terminal and coupled in parallel with the third resistor circuit string, wherein each of the third resistor circuit string and the fourth resistor circuit string comprises a plurality of resistor circuits coupled sequentially, wherein the plurality of resistor circuits of the third resistor circuit string and the fourth resistor circuit string are arranged along the first direction, wherein the first resistor, the second resistor and the third resistor of each resistor circuit of the third resistor circuit string are sequentially arranged along the first direction, wherein the third resistor, the second resistor and the first resistor of each resistor circuit of the fourth resistor circuit string are sequentially arranged along the first direction, and wherein the first resistor circuit string, the second resistor circuit string, the third resistor circuit string and the fourth resistor circuit string form an array with two rows and two columns in the resistor array circuit, the first resistor circuit string and the second resistor circuit string are located in two diagonal ones of the array, and the third resistor circuit string and the fourth resistor circuit string are located in the other two diagonal ones of the array.

* * * * *